Dec. 7, 1954

W. VAN B. ROBERTS 2,696,560

MAGNETOSTRICTIVE OSCILLATOR

Filed May 9, 1951

INVENTOR
Walter Van B. Roberts
BY
Charles H. Brown
ATTORNEY

United States Patent Office 2,696,560

Patented Dec. 7, 1954

2,696,560

MAGNETOSTRICTIVE OSCILLATOR

Walter van Braam Roberts, Princeton, N. J., assignor to Radio Corporation of America, a corporation of Delaware Application May 9, 1951, Serial No. 225,295

8 Claims. (Cl. 250—36)

This invention relates to vacuum tube oscillators and more particularly to such oscillators in which the frequency is controlled by a magnetostrictive resonator.

The use of magnetostrictive resonators in oscillator circuits is well known. Most of the prior art in this field is directed to the utilization of a rod of magnetostrictive material as a coupling means between different portions of the circuit. The present invention, in its broad aspects, employs a magnetostrictive resonator to change the reactance characteristics of a circuit element in the vicinity of its resonance points to both enable and control oscillations.

An object of the invention is to provide an oscillator having a plurality of circuit branches in which a magnetostrictive resonator is used to change the reactance of one circuit branch in the vicinity of resonance of the resonator.

Another object of this invention is to provide a permanently magnetized ferrite resonator as an element in an oscillator in such manner that oscillation is obtained solely by virtue of a change in the reactance of a circuit component due to the mechanical vibration of the ferrite resonator.

A further object of this invention is to provide an oscillator circuit, the frequency of which is controlled by a magnetostrictive resonator coupled to the electrical circuits by a single conductor passing through a hole in the resonator.

A still further object of this invention is to provide an oscillator whose frequency is controlled by a biased magnetostrictive vibrator which is driven by a single conductor linking closed loops of permanent magnetization.

In accordance with one embodiment of this invention, a magnetostrictive oscillator circuit operating solely by virtue of mechanical vibration of a ferrite resonator has only a single conductor passing through a hole in the resonator. In the absence of motion of the resonator, the circuit is non-oscillatory due to the sign of the reactance in its branches. The term branch is herein used to designate a current path or leg of the electrical network constituting an oscillation generator. At frequencies near the mechanical resonances of the magnetostrictive element, however, the motion of the resonator acts to alter the reactance of the branch from inductive to capacitive, and oscillation results.

In another embodiment of this invention, a biased resonator having a single turn passing through a hole in the resonator is coupled by a transformer in a branch of a non-oscillatory circuit to change the reactance of that branch to make the circuit oscillate at one of the frequencies near mechanical resonance of the magnetostrictive vibrator.

In the description following, the ferrite resonators are considered to be properly biased by a magnetic field. Methods of permanently magnetizing ferrite rings in closed loops, which rings are suitable for use in the oscillator circuit of this invention, are disclosed and claimed in my co-pending application, Serial No. 202,091, filed December 21, 1950.

The invention, both as to its organization and method of operation, together with additional objects and advantages thereof, will best be understood by reference to the specification when read in connection with the accompanying drawing in which.

Figures 1, 2, 3, 4, 5, 6, 7, 8:
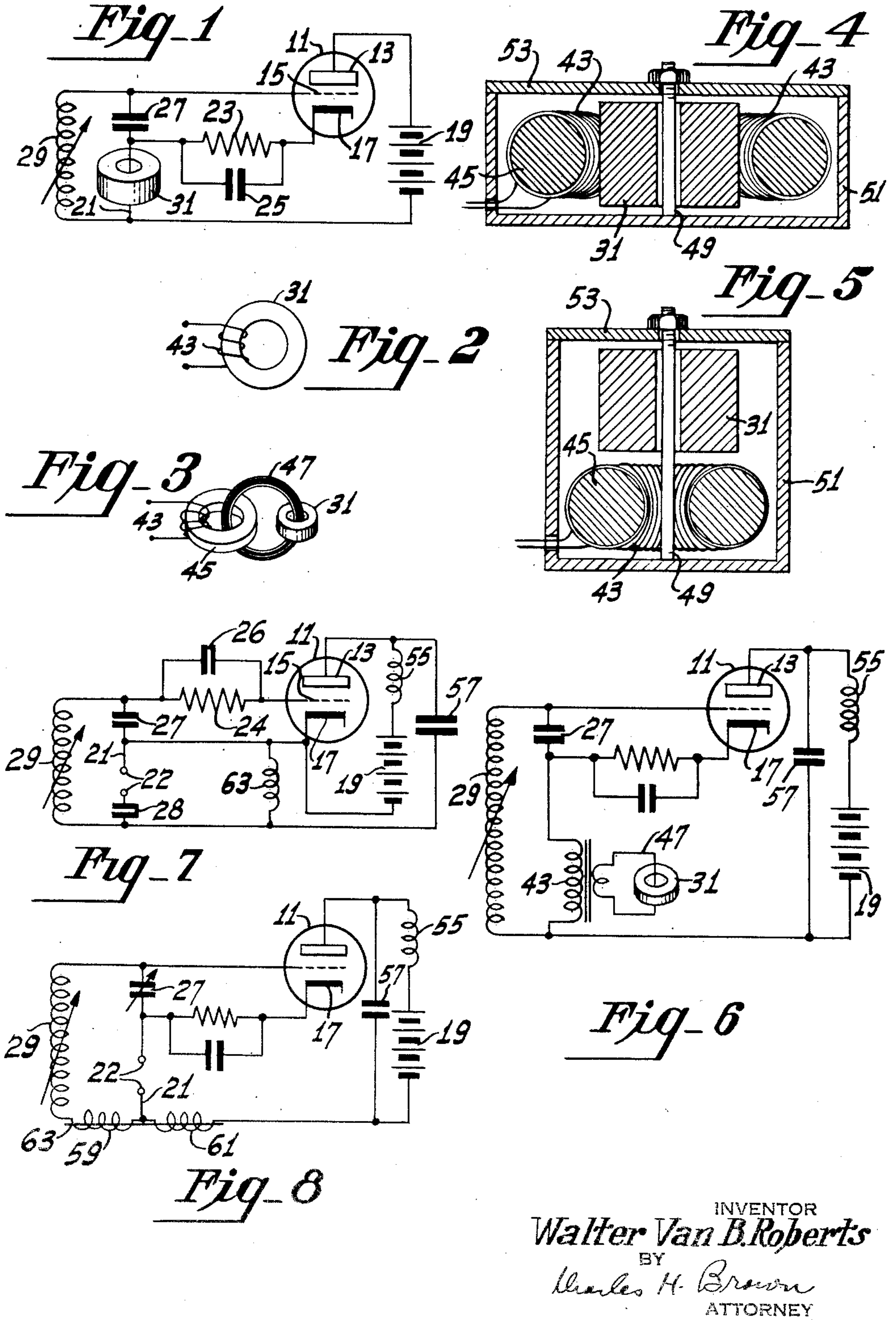
Fig. 1 shows an oscillator in accordance with the present invention having a toroidal resonator in one circuit branch.
Fig. 2 shows schematically a toroidal resonator and associated actuating coil which may be used as a detail to replace certain circuit elements of Fig. 1.
Fig. 3 is a transformer arrangement with a multiturn primary and a single conductor secondary linking the resonator which may be used in the oscillator circuit of the invention.
Fig. 4 is a cross-sectional view of a transformer in accordance with the principles of Fig. 3.
Fig. 5 is a cross-sectional view of another transformer utilizing the same principles.
Fig. 6 is a schematic diagram of an oscillator in accordance with the invention utilizing a transformer arrangement, which transformer may be any one of Figs. 3, 4, or 5.
Fig. 7 is another oscillator in accordance with this invention.
Fig. 8 is another oscillator in accordance with the teachings of this invention having a regenerative feedback coupling.

Referring now to the drawing, Fig. 1 shows an oscillator having a toroidal resonator as the oscillation inducing and controlling agency. An electron discharge device 11 having within an evacuated envelope an anode 13, a control electrode or grid 15, and a cathode 17, has its anode 13 connected to the positive terminal of a source of unidirectional potential 19. The negative side of the source of potential 19 is connected through a lead 21 and a grid-biasing circuit composed of a resistor 23 in parallel with a capacitor 25 to the cathode 17 of the discharge device 11. A capacitor 27 is connected between the grid 15 and the junction of lead 21 with the grid biasing circuit 23, 25. A variable inductance 29, also connected to the grid 15, is returned to the negative side of the source of potential 19.

A mechanical resonator 31 is shown as a ring or torus through which passes the lead 21 connecting the cathode circuit to the junction of the anode circuit and the inductance 29. The resonator 31 is suitably biased by a magnetizing field, not shown, and is preferably permanently magnetized.

The circuit shown in Fig. 1 is non-oscillatory as long as the reactance between the cathode 17 and the anode 13 of the electron discharge device 11 is of opposite sign to the reactance between the cathode 17 and the grid 15. It is known that the grid-cathode reactance must be of the same sign as the cathode-anode reactance, and both of these reactances must be of opposite sign to the grid-anode reactance for the circuit to oscillate.

When the resonator 31 is not in vibration, its effect is merely to increase the inductance of the lead 21 because of the permeability of the material composing the ring. As stated above, the toroidal resonator 31 is preferably composed of ferrites (sometimes referred to as a ferro-spinel) which have high permeability of the order of hundreds. They are magnetostrictive and when suitably biased will react on the wire passing through the torus in such a way that at frequencies above the natural frequency of vibration of the ring, capacitive reactance is effectively inserted in series in the wire. If the mechanical Q and the magnetostrictive activity of the resonator 31 are sufficient, this capacitive reactance will overcome the normal inductance of the lead 21 and the flux linkage of the lead 21 with the resonator 31.

The result is that for a narrow range of frequencies the total reactance of the anode to cathode path is capacitive and the circuit has fulfilled one of the conditions for oscillation. The other condition is that the capacitor 27 and the variable inductance 29 must be tuned so that the entire loop including the capacitor 27, the inductance 29, and the lead 21 has zero reactance at a frequency within the range at which the reactance of lead 21 is capacitive. The range within which oscillation is possible is usually very small and the mechanical Q of the resonator 31 is usually very much larger than that of the electrical circuits. The small range of possible oscillation frequency due to the high mechanical Q of the resonator 31 produces a frequency of oscillation which is much less subject to variation from such causes as voltage fluctuation, changing tube characteristics, and the like.

It is of course to be understood that to obtain oscillation it is also necessary for the discharge device 11 to have sufficient transconductance and the inductance 29 to have a reasonably high value of Q. Stated mathematically, the following equation must be met:

$$XQg>1$$

in which X represents the reactance of the lead 21 including the effects of its coupling with the toroidal resonator 31, Q represents the Q of the inductance 29, and $g$ is the transconductance of the discharge device 11.

The maximum possible value of X is $\frac{1}{2}Q_2K^2\omega L-\omega L$ where K is the coefficient of coupling between the lead 21 and the resonator 31, $Q_2$ is the mechanical Q of the resonator, and L is the inductance of lead 21 in the absence of motion of the resonator 31. It has been found that values of K up to about $\frac{1}{10}$ can be obtained with optimally biased ferrites, and that $Q_2$ is of the order of 2000. Hence of the reactance $\omega$L is for example 1 ohm, X can be as high as something like 9 ohms. Actually the maximum value of X occurs at a frequency at which there is also considerable resistance so that a value more like 1 or 2 ohms should be taken for X in the above example. Assuming $X=2$ ohms and $Q=100$, it is seen that $g$ must exceed 5000 microhms for oscillation. Of course, if the inductance L is increased by putting more than one turn on the torroidal resonator 31, X will increase as the square of the number of turns and the required value of $g$ will be reduced.

In Fig. 2 there is shown a toroidal resonator with its associated actuating coil. A magnetostrictive resonator 31 has a multiturn winding 43 thereon. The resonator 31 need not be of toroidal shape as shown. It may be a rod or cylinder driven in the usual manner by a coil, providing of course that there is the proper magnetic biasing field present in the resonator. The amount of effective capacitance which will be inserted in series in the winding 43 by the action of the resonator 31 near its resonance points will increase as the square of the number of turns on the resonator. Also, the inductance of the winding 43 increases as the square of the number of turns on the resonator 31. It has been found that oscillations occur more readily with a multiturn winding than with the single wire passing through a hole in the toroidal resonator. Systems which give the advantages of a multiturn coil on the resonator 31 but which have a single-turn secondary to multiply the effect of the resonator on the winding 43 are shown below and are described in connection with Figs. 3, 4 and 5.

Fig. 3 is a transformer arrangement having a multiturn primary 43 on a high permeability core 45 with a single-turn secondary 47 which passes through the biased resonator 31. The single-turn secondary winding 47 supplies the resonator 31 with a greater current than flows in the multiturn primary winding 43. The impedance appearing in the single conductor secondary 47 of the transformer arrangement will be multiplied by the square of the turns ratio and appear across the terminals of the multiturn primary 43, but is reduced by the coefficient of coupling. The component of inductance due to the primary coil 43 also appears in series unreduced by the coefficient of coupling. This series inductance subtracts from the capacity reactance resulting from the resonator 31 and its effect can be reduced only by increasing the coefficient of coupling.

Fig. 4 shows a cross-sectional view of a practical construction of a transformer with a closed magnetic path and a single-turn secondary in accordance with the principles of Fig. 3. A high permeability toroidal core 45, having a multiturn winding 43 thereon, surrounds the toroidal resonator 31. The single turn secondary is composed of a short rod 49 passing through the hole in the resonator 31 and the top, sides, and bottom of the transformer case 51. The advantages of a closed magnetic path in the core 45 and a single-turn secondary through the conductive rod 49 and the transformer case 51 are preserved, giving a high coefficient of coupling between the coil 43 and the resonator 31. The transformer case 51 may be of flat material, in which instance the sides of the tarnsformer case 51 would be merely two straps closing the rod 49 on its ends. Preferably, however, transformer case 51 is a figure of revolution completely enclosing the high permeability core 45 with its associated multiturn coil 43 and the toroidal resonator 31.

The construction shown in Fig. 4 is mechanically very stable and provides a convenient unit for mounting the resonator 31. The top 53 is made removable so that the resonator 31 can be replaced quickly and easily when it is desired to change the frequency of oscillation of the circuit shown in Fig. 1 by changing resonators.

Fig. 5 is a cross-sectional view of another practical transformer utilizing the principle of the arrangement shown in Fig. 3. In this embodiment, the high permeability core 45, with its associated multi-turn coil 43 thereon, is placed below the toroidal resonator 31 with the conductive rod 49 extending through the openings in the core 45 and the resonator 31 and acting as a single-turn secondary through the top, sides, and bottom of the transformer case 51, in the same manner as the construction shown in Fig. 4. For convenience, the top 53 of the transformer case 51 is also made removable for easy change of the toroidal resonator 31. As in the case of Fig. 4, the transformer case 51 may be of flat metal construction in which copper or some other high-conductivity material is employed; or the transformer case 51 may be a surface of revolution.

Fig. 6 is a schematic diagram of a completed oscillator in accordance with this invention utilizing the transformer arrangement of Figs. 3, 4, or 5. The connections of the various components and their functions are the same as those of Fig. 1 except that a radio frequency choke 55 is shown in series with the source of potential 19, and a by-pass capacitor 57 provides the alternating current path for the oscillatory voltage. It will be noted that the multiturn coil 43 has been substituted in the circuit in place of the lead 21 in Fig. 1 to couple the anode 13 of the discharge device 11 to the cathode 17. The resonator 31 is coupled by the single-turn secondary 47 to the primary winding 43. The capacitor 27 and the variable inductance 29, which form a loop with the multi-turn coil 43 of the transformer, must be tuned so that the entire loop has zero reactance at a frequency within the range in which the effective reactance of multi-turn winding 43 is capacitive in the same manner as explained in connection with Fig. 1.

Fig. 7 shows another oscillatory circuit in accordance with this invention which may utilize the transformer arrangements of Figs. 3, 4 or 5. The discharge device 11 having an anode 13, a control electrode or grid 15, and a cathode 17 has its anode 13 connected to a source of potential 19 through a radio frequency choke 55, and the cathode 17 is connected to the negative side of the source of potential 19. A by-pass capacitor 57 in series with the anode 13 and the junction of the grid-anode branch and the anode-cathode branch provides an alternating current path for the oscillatory voltage. A pair of terminals 22 is shown interposed in the lead 21, at which terminals may be connected the transformer primary winding 43 of Figs. 3, 4 or 5. A capacitance 28 is placed in series with the pair of terminals 22 to overcome some of the inductance introduced by a multiturn winding. A grid bias circuit consisting of a resistor 24 having a capacitor 26 in shunt therewith is interposed between the connection of the inductance 29 and the capacitor 27 and the grid 15 of discharge device 11. A choke 63 provides the grid-cathode direct current path for biasing the discharge device 11. This method of getting bias can be used in any of the circuits as long as oscillations are not prevented from starting by the lack of initial bias.

When utilizing the circuit of Fig. 7, care must be taken that oscillations do not occur due to the action of the capacitor 28, which oscillations would be independent of and uncontrolled by the resonator. The reactance of the branch containing the capacitor 28 and the coil or resonator across the terminals 22 must still be effectively inductive while the resonator is not in motion. Upon the initiation of oscillation, the resonator will then act to interpose sufficient capacitive reactance to overcome the inductive sign of the branch. The loop which must be tuned to zero reactance in the circuit of Fig. 7 for oscillations to occur consists of capacitor 27, variable inductance 29, capacitor 28, and the primary winding of one of the transformers shown in Figs. 3, 4, or 5 appearing across the terminals 22.

It should be noted that the circuit of Fig. 7 can be made non-oscillatory by making the ratio of the anode-cathode circuit capacity reactance to the grid-cathode circuit capacity reactance greater than the amplification factor of the discharge device 11. Oscillations then occur only when the resonator effectively puts inductive reactance into its circuit. This method of operation is more complicated, however, because there is inductance present also between anode and cathode and because the amplification factor is not very constant.

Fig. 8 shows another circuit utilizing the teachings of this invention which is similar to that of Fig. 6 except that a small amount of regenerative feedback has been introduced. The components and their functions in Fig. 8 are the same as those described in connection with Fig. 6 and Fig. 1 except that a pair of terminals 22 has been interposed in lead 21 across which may be connected the multiturn primary winding 43 of Figs. 3, 4, or 5, and a small center-tapped regenerative coupling coil 59, 61 having a movable ferrite rod 63 linking the two sections of the coil 59, 61 has been added, with one section 59 in the grid-cathode circuit and the other section 61 in the anode cathode circuit. The center tap of the coil between the two sections 59, 61 is connected to the lead 21. The permeable core or rod 63 linking the two sections of the feedback coil 59, 61 is adjusted to give a feedback coupling which of itself is insufficient to sustain oscillations. In the case of the circuit shown in Fig. 8, the loop containing the capacitor 27, the inductance 29, one regenerative coupling coil section 59, and the impedance of the multiturn primary appearing across the terminals 22 must be tuned to zero reactance for the circuit to oscillate.

The type of feedback shown in Fig. 8, regenerative coupling of the coil sections 59, 61 is more effective at the higher frequencies, while the capacitor arrangement shown in Fig. 7 is more effective at the lower frequencies. A circuit with a switching system which provides both types will give a fairly uniform regeneration over a considerable range of frequencies. This may be desirable if the same resonator is to be used in a number of different modes by merely retuning the loop circuit utilizing a variable capacitor 27, a variable inductance 29, or both.

It is preferable, however, to use a resonator which requires no regeneration. For example, a ferrite cylinder 6.8 mm. long, 8.2 mm. in diameter, with an axial hole about 1 mm. in diameter oscillated in the circuit of Fig. 1, successfully tested, at either 360 kc. or 580 kc. according to the tuning of the variable inductance 29.

It will be understood, of course, that the capacitor 27 in the grid-cathode circuit may be made variable for the purposes of tuning the loop circuit in Figs. 1, 6 and 7, and that each tuning operation may utilize a variable capacitor, a variable inductance, or both, depending upon the frequency of vibration of the resonator 31 as determined by its length, diameter, and mode of vibration.

What is claimed is:

1. An oscillatory system comprising an electron discharge device having a cathode, an anode, and a control electrode, an inductive coupling between said anode and said control electrode, a capacitive coupling between said control electrode and said cathode, a magnetostrictive resonator, a high permeability core, and a connection from said cathode to said anode including a primary multiturn winding on said high permeability core, said core having a single turn secondary linking said primary winding with closed loops of magnetization in said magnetostrictive resonator.

2. An oscillatory system comprising an electron discharge device having a cathode, an anode, and a control electrode, an inductive coupling between said anode and said control electrode, a capacitive coupling between said control electrode and said cathode, a ferrite core, a toroidal magnetostrictive ferrite resonator, and a connection from said cathode to said anode including a primary winding on said ferrite core, said core having a single turn secondary linking said core and said primary winding with closed loops of permanent magnetization in said toroidal magnetostrictive ferrite resonator.

3. An oscillatory system comprising an electron discharge device having a cathode, an anode, and a control electrode, an inductive coupling between said anode and said control electrode, a capacitive coupling between said control electrode and said cathode, a ferrite core, a toroidal magnetostrictive ferrite resonator, a connection from said cathode to said anode including a primary winding on said ferrite core, said core having a single turn secondary linking said core and said primary winding with closed loops of permanent magnetization in said toroidal magnetostrictive ferrite resonator, and a two section feedback coil, the separate sections of which are linked by a magnetostrictive resonator, one section of said feedback coil being connected in series in said control electrode-cathode circuit, the other section of said feedback coil being connected in said anode-cathode circuit.

4. An oscillatory system comprising an electron discharge device having a cathode, an anode, and a control electrode, an inductive coupling between said anode and said control electrode, a capacitive coupling between said control electrode and said cathode, a ferrite core, a toroidal magnetostrictive ferrite resonator, a connection from said cathode to said anode including a primary winding on said ferrite core, said core having a single-turn secondary linking said core and said primary winding with closed loops of permanent magnetization in said toroidal magnetostrictive ferrite resonator, and a capacitor in said cathode-anode circuit in series with said multiturn winding.

5. A magnetostrictive device comprising a highly permeable magnetic core having an opening therein, a multiturn winding on said core, a magnetostrictive resonator also having an opening therein, and a conductor linking said core and said resonator by passing through the openings therein.

6. A magnetostrictive device as defined in claim 5 in which said conductor includes a shell inclosing the entire device.

7. A magnetostrictive device as defined in claim 5 wherein said resonator is a torus made of ferrite material.

8. In a system for producing oscillations, an electron discharge device having a cathode, an anode, and a control electrode, an inductive coupling between said control electrode and said anode of said discharge device, a capacitive coupling between said control electrode and said cathode, a normally inductive coupling between said anode and said cathode when said system is in a non-oscillatory condition, and magnetostrictive resonating means coupled to said anode-cathode circuit for introducing capacitive reactance into said anode-cathode circuit at frequencies near mechanical resonance of said resonator, said normally inductive coupling including a multiturn primary winding on a high permeability core having a single turn secondary thereon linking said winding with said magnetostrictive resonating means.

References Cited in the file of this patent

UNITED STATES PATENTS

| Number | Name | Date |
|---|---|---|
| 1,606,791 | Horton | Nov. 16, 1926 |
| 2,012,497 | Clapp | Aug. 27, 1935 |
| 2,438,382 | Born | Mar. 23, 1948 |
| 2,611,094 | Rex | Sept. 16, 1952 |
| 2,619,604 | Burns | Nov. 25, 1952 |